310 322 SR

7/15/86 XR 4,600,851

United States Patent [19]

Isayama et al.

[11] Patent Number: 4,600,851

[45] Date of Patent: Jul. 15, 1986

[54] PIEZOELECTRIC BUZZER WITH CIRCUIT ELEMENTS MOUNTED ON NODAL AREAS

[75] Inventors: Teruo Isayama; Yukinobu Takeuchi; Yoshikazu Ikeda; Sigeuki Kondo; Seiichi Yoshikawa, all of Kosai, Japan

[73] Assignee: Fuji Electrochemical Co., Ltd., Tokyo, Japan

[21] Appl. No.: 767,084

[22] Filed: Aug. 19, 1985

Related U.S. Application Data

[63] Continuation-in-part of Ser. No. 599,748, Apr. 11, 1984, abandoned.

[51] Int. Cl.[4] .............................................. H01L 41/08

[52] U.S. Cl. .................................... 310/324; 310/317; 310/322; 310/366

[58] Field of Search ............... 310/321, 322, 324, 317, 310/365, 366, 348; 179/110 A; 340/384 R, 384 E, 388

[56] References Cited

U.S. PATENT DOCUMENTS

| | | | |
|---|---|---|---|
| 4,004,409 | 1/1977 | Ganter | 310/324 X |
| 4,122,365 | 10/1978 | Stephens | 310/324 |
| 4,230,383 | 10/1980 | Burnstein et al. | 310/324 X |

*Primary Examiner*—Mark O. Budd
*Attorney, Agent, or Firm*—Wenderoth, Lind & Ponack

[57] ABSTRACT

A piezoelectric buzzer includes a tone generator formed by bonding, to a resilient thin plate, a piezoelectric element having deposited thereon thin film electrodes, and an oscillation circuit formed by electronic parts connected to the electrodes. A conductive carrying area of a predetermined pattern is formed on the upper surface of the piezoelectric element along nodal points of vibration of the tone generator, and the electronic parts are fixedly mounted on the carrying area to constitute the oscillation circuit.

7 Claims, 6 Drawing Figures

F = Frequency

VF = Feedback Voltage

N = Nodal Point

PIEZOELECTRIC BUZZER WITH CIRCUIT ELEMENTS MOUNTED ON NODAL AREAS

This is a continuation-in-part of application Ser. No. 599,748 filed April 11, 1984, now abandoned.

BACKGROUND OF THE INVENTION

1. Field of the Invention

The present invention relates to a piezoelectric buzzer and, more particularly, to improvement in or relating to a piezoelectric buzzer of the type wherein electric force is applied to a tone generator having a piezoelectric element adhered to a resilient thin plate, thereby vibrating the tone generator to generate acoustic waves at a specific frequency.

2. Description of the Prior Art

Heretofore there have been proposed a variety of so-called piezoelectric buzzers which utilize such a characteristic of a piezoelectric element that when energized by electric force, it vibrates at a specific frequency. FIG. 1 illustrates the structure of a prior art example.

With such a structure, however, the conventional piezoelectric buzzer cannot fully meet a recent demand for miniaturization of electronic devices.

The piezoelectric buzzer shown in FIG. 1 comprises a flat cylindrical case 10, a cover 12, a tone generator 14 and a printed-circuit board 18 carrying electronic parts 16 such as a resistor, a transistor and so forth. The tone generator 14 has a substantially disc-shaped piezoelectric element 20 bonded to a substantially disc-shaped resilient thin plate 22 centrally thereof. The resilient thin plate 22 is, in turn, fixedly secured with an adhesive binder 24 as of silicone rubber to a circular projection 26 extending from the inside of the top panel of the case 10.

Under the tone generator 14, the printed-circuit board 18 is retained at its marginal edge to the inner wall of the case 10. Beneath the printed-circuit board 18 the cover 12 is also fitted at its marginal edge in the inner wall of the case 10.

The piezoelectric buzzer of such a structure not only involves the printed-circuit board 18 but also calls for electrically connecting electrode parts of the tone generator 14 to the printed-circuit board 18 by means of leads 28. Since the space in the case 10 is relatively small, such a wiring operation is troublesome and inevitably raises the manufacturing cost of the piezoelectric buzzer.

For the miniaturization of the above-described piezoelectric buzzer, it is considered to lay the electronic parts 16 on their sides on the printed-circuit board 18, or to replace them with a metal electrode face bonding type having no projecting lead, which has been developed in recent years, but these proposals do not fully satisfy the demand for miniaturization.

One of solutions to the above disadvantages is to mount the electronic parts directly on the tone generator. Although this appears to be a simple and effective solution, it practically involves the following problems. That is, if the electronic parts are placed on the tone generator at random, the specific frequency of the generator is unfavorably affected by those parts, resulting in generation of undesirable sound. Further, in case that the electronic parts are mounted on the piezolectric element in a random manner, those parts constitutes an electrical stress to reduce a feedback voltage so that a self-excited oscillation of the piezoelectric element becomes unstable and an efficiency of electroacoustic conversion is lowered.

The present inventors, upon a considerable research, have found that by mounting the electronic parts on nodal points where an amplitude of vibration of the tone generator is zero, influence to the specific frequency of the generator may be removed to thereby obtain acoustic waves at a desired frequency efficiently. Location of the nodal points can be computed relatively easily once the specific frequency of the generator is set. Alternatively, the nodal points may be actually located by plotting or tracing a portion where no vibration is observed while subjecting the tone generator to a free vibration. In order to utilize the above knowledge for industrial production of the piezoelectric buzzer, however, there is a difficulty to be overcome which is how to position the electronic parts on the nodal points exactly and efficiently during a process to fix those parts onto the tone generator by, for example, soldering.

SUMMARY OF THE INVENTION

It is therefore an object of the present invention to provide a piezoelectric buzzer which can be miniaturized without raising the manufacturing cost thereof.

Another object of the present invention is to provide a piezoelectric buzzer which permits efficient vibration of a tone generator with minimized electroacoustic conversion loss.

According to the present invention, a piezoelectric buzzer comprises a tone generator and an oscillation circuit, the tone generator comprising a resilient thin plate and a piezoelectric element having formed thereon conductive thin film electrodes and bonded to said plate, the oscillation circuit being formed by electronic parts connected to the electrodes. The piezoelectric element is formed on the upper surface thereof with a conductive carrying area of a predetermined pattern along nodal points where amplitude of vibration of the tone generator is zero and of which location is determined by a specific frequency of the vibration determined by factors including the thickness and diameter of the tone generator. Fixedly mounted on the carrying area are the electronic parts to constitute the oscillation circuit.

The electronic parts are preferably mounted on the carrying area at equal intervals. More preferably, the electronic parts are fixed within a portion of substantially 0.1 inch width of which center is the nodal points.

The piezoelectric element and the resilient thin plate may be disc-shaped.

Other objects, features and advantages of the present invention will be apparent from the following detailed description of preferred embodiments thereof when taken in conjunction with the accompanying drawings, in which:

DETAILED DESCRIPTION OF THE INVENTION

Figure 1:
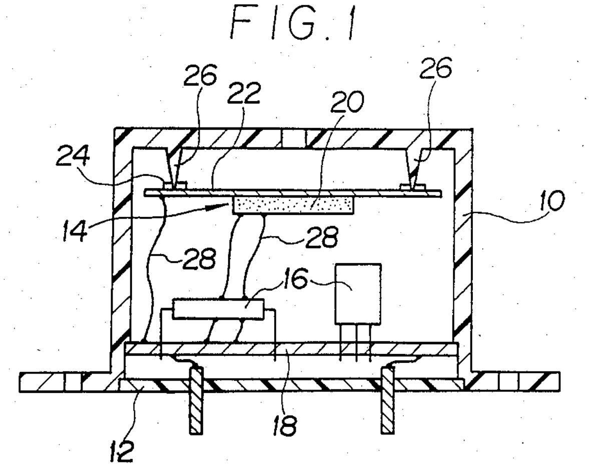
FIG. 1 is a schematic diagram, partly in section, showing an example of conventional piezoelectric buzzers.

A description will be given, with reference to FIGS. 2 and 3, of an embodiment of the present invention. In the following, the parts identical with or corresponding to those in FIG. 1 are identified by the same reference numerals.

Figure 2:
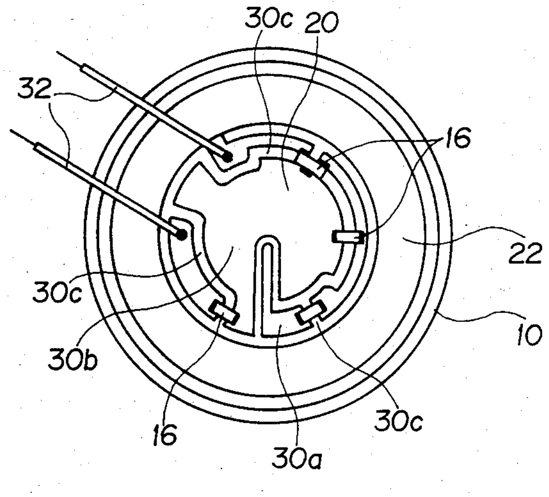
FIG. 2 is a plan view illustrating a tone generator and an oscillation circuit of a piezoelectric buzzer in accordance with an embodiment of the present invention.
Figure 3:
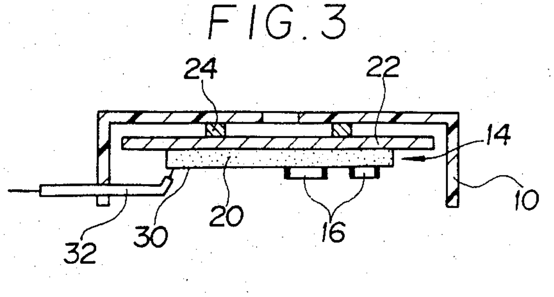
FIG. 3 is a sectional side view showing a part of the piezoelectric buzzer in FIG. 2.

The piezoelectric buzzer illustrated in FIGS. 2 and 3 comprises a flat but cylindrical case 10 which is made of synthetic resin or the like and open at its lower end, and a tone generator 14 which has a disc-shaped piezoelectric element 20 bonded to a disc-shaped resilient thin plate 22. The piezoelectric element 20 is preferably formed by barium titanate or lead titanate zirconate. On the piezoelectric element 20 is formed as by evaporation a thin-film-like conductive layer 30, which is separated into a drive electrode 30*a* and a feedback electrode 30*b*. The electrodes 30*a* and 30*b* are electrically connected to an oscillation circuit to vibrate the tone generator 14 at a specific natural frequency.

The feedback electrode 30*b* formed by the conductive layer 30 is subdivided to provide along nodal points a conductive carrying area 30*c* of a predetermined pattern, on which a transistor, a resistor and like electronic parts 16 are fixedly mounted, at equal intervals in the illustrated embodiment, to form the oscillation circuit. As each of the electronic parts 16 is of a substantial size, in a strict sense of the term these are mounted within a portion having a certain width about the nodal points. Preferably, such a portion has a width of approximately 0.1 inch in the radial direction with the nodal points being at the center thereof, and the electronic parts 16 to be used are selected so that they may be mounted within such a width. The electronic parts 16 may be conventional ones provided with leads, but it is desirable to use parts of the metal electrode face bonding type having no projecting leads, which parts permit further miniaturization of the buzzer and facilitate the exact mount within the above portion. The arrangement of electronic parts 16 at equal intervals serves to minimize an influence to the specific frequency of the tone generator.

Figure 4:
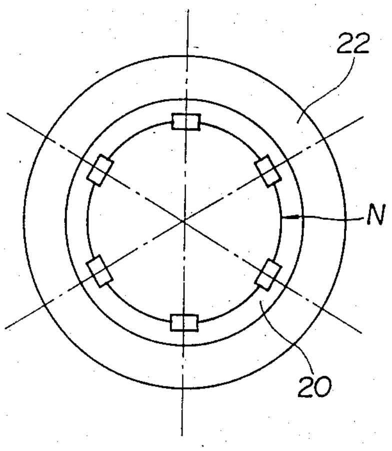
FIG. 4 is an explanatory schematic view showing location of electronic parts and external leads.
Figure 5:
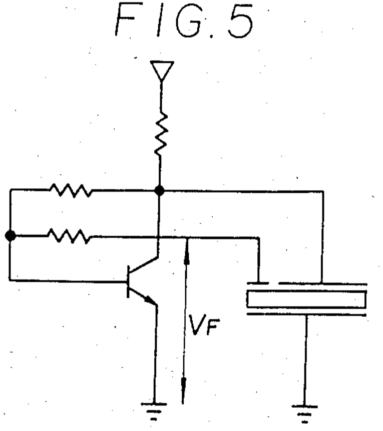
FIG. 5 is an electrically equivalent circuit of the oscillation circuit in FIG. 2.

For maintaining the electrical characteristics of the piezoelectric buzzer, it is desirable that leads 32 for external connection be connected to the piezoelectric element 20 also at the nodal points of vibration of the tone generator 14 and at equal intervals with the electronic parts 16. Thus, in the illustrated embodiment the disc-shaped piezoelectric element 20 is imaginarily divided into six sections in which the electronic parts 16 and the leads 32 are respectively fixed centrally thereof in the circumferential direction. These arrangements are more clearly shown in FIG. 4 where reference letter "N" indicates a line along which the nodal points are distributted. It will be seen that the disc-shape of the piezoelectric element 20 and the resilient thin plate 22 causes the nodal points to be distributed concentrically. This means that the location of nodal points can be computed relatively easily by setting the specific frequency of the tone generator 14. Accordingly, formation of the carrying area 30*c* along the nodal points can be made without involving any particular difficulties.

Further, the resilient thin plate 22 is bonded to the case 10 with the adhesive binder 24 advantageously at the nodal points of the tone generator 14.

Connecting the external connection leads 32 of the piezoelectric buzzer to a predetermined power supply, the oscillation circuit formed by the electronic parts 16 and the tone generator 14 cooperate to perform a self-excited oscillation. Since the piezoelectric element 20 is bonded to the resilient thin plate 22, its oscillation becomes a vibration or wobbling motion of the generator 14, generating sound waves of a fixed specific frequency which is determined by the thickness and diameter of the tone generator 14.

It must be noted here that the electronic parts 16 mounted on the carrying area 30*c* formed along the nodal points of the tone generator 14 does not affect at all the specific frequency of the generator 14. This permits efficient vibration of the tone generator 14 with substantially no electroacoustic conversion loss. The carrying area 30*c* enables to mount each of the electronic parts 16 exactly and efficiently on the nodal points, thereby making it possible to manufacture the above-described piezoelectric buzzer in an industrial scale and on a commercial basis. Furthermore, the arrangement of the electronic parts 16 on the carrying area 30*c* formed along the nodal points reduces stress on the piezuelectric element 20, resulting in an increase of feedback boltage to achieve a stable oscillation.

Figure 6:
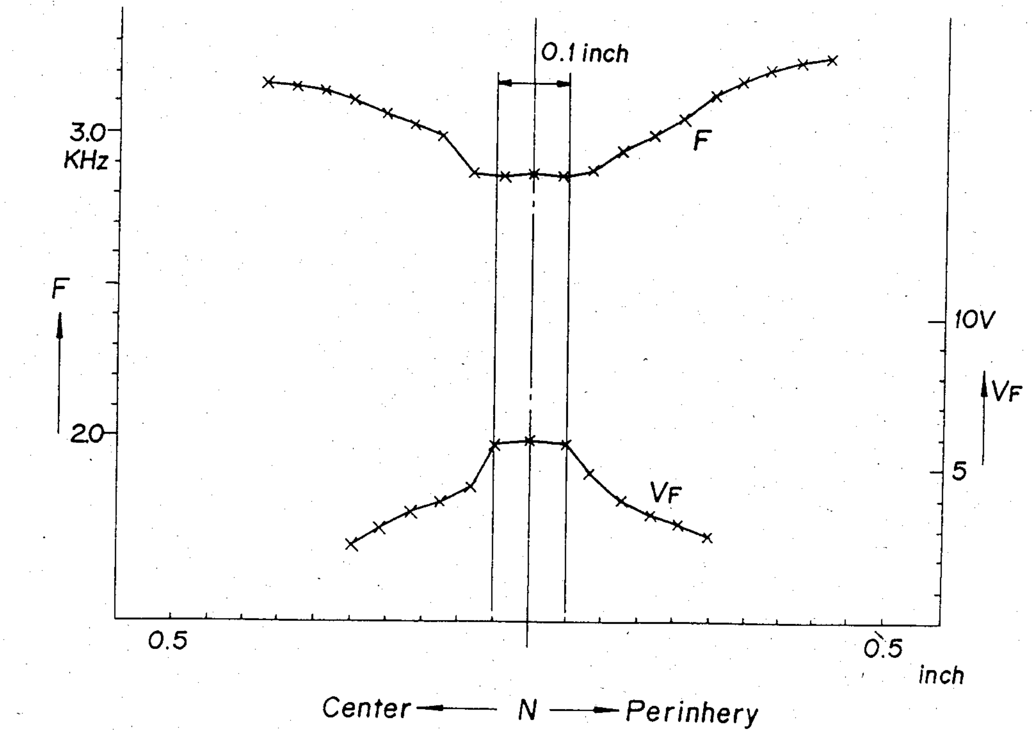
FIG. 6 is a graph showing results of experimentation made by the present inventors.

The advantageous effects of the present invention as discussed above will be realized from results of experimentation described hereinunder with reference to FIG. 6. In the experimentation, samples of the tone generator were prepared in which diameters of the resilient thin plates and the piezoelectric elements are in the ratio 10:7 and which had the specific frequency of approximately 2.85 KHz. A terminal voltage applied to the samples was fixed at a predetermined value for all samples while the electronic parts were arranged at different positions for the respective samples. Measured under those conditions were the feedback voltage and the frequency, of which results are shown in FIG. 6. It will be seen that when the electronic parts were mounted within a portion of 0.1 inch width of which center is the nodal points, the feedback voltage was maximized and the frequency was approximated to the specific natural frequency. This means that the electroacoustic conversion can be effected most efficiently when the electronic parts are mounted within the above portion.

Furthermore, the elimination of the electronic part carrying printed-circuit board 18 required in the conventional buzzer not only greatly facilitates the miniaturization of the piezoelectric buzzer but also eliminates the necessity of such a troublesome wiring operation for interconnecting the printed-circuit board 18 and the tone generator 14 in the narrow space of the case 10, thus contributing largely to the enhancement of productivity and the curtailment of manufacturing costs.

Although the present invention has been described with reference to the preferred embodiment thereof, many modifications and alterations may be made within the spirit of the present invention.

What is claimed is:

1. In a piezoelectric buzzer comprising a tone generator and an oscillation circuit, said tone generator comprising a resilient thin plate and a piezoelectric element having formed thereon conductive thin film electrodes and bonded to said resilient thin plate, and said oscillation circuit being formed by electronic parts connected to said electrodes, the improvement wherein:

said piezoelectric element is formed on the upper surface thereof with a conductive carrying area of a predetermined pattern along nodal points where amplitude of vibration of said tone generator is zero, and the location of said nodal points being determined by a specific frequency of said vibration which is determined by factors including the thickness and diameter of said tone generator; and said electronic parts are fixedly mounted on said carrying area to constitute said oscillation circuit.

2. A piezoelectric buzzer as claimed in claim 1, wherein said electronic parts are mounted on said carrying area at equal intervals.

3. A piezoelectric buzzer as claimed in claim 1, wherein said electronic parts are mounted within a portion of substantially 0.1 inch width of which center is said nodal points.

4. A piezoelectric buzzer as claimed in claim 1, wherein said piezoelectric element and said resilient thin plate are disc-shaped.

5. A piezoelectric buzzer as claimed in claim 4, further comprising external connection leads connecting said oscillation circuit to a power supply, and a case supporting said resilient thin plate, said leads being connected at said nodal points and said resilient thin plate being bonded at said nodal points to said case.

6. A piezoelectric buzzer as claimed in claim 1, wherein said piezoelectric element is formed of one of barium titanate and lead titanate zirconate.

7. A piezoelectric buzzer as claimed in claim 1, wherein said electronic parts of said oscillation circuit are of the metal electrode face bonding type having no projecting lead.

* * * * *